: (12) United States Patent
Melanson

(10) Patent No.: US 7,746,043 B2
(45) Date of Patent: Jun. 29, 2010

(54) INDUCTOR FLYBACK DETECTION USING SWITCH GATE CHANGE CHARACTERISTIC DETECTION

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 51 days.

(21) Appl. No.: 11/967,273

(22) Filed: Dec. 31, 2007

(65) Prior Publication Data

US 2008/0272755 A1 Nov. 6, 2008

Related U.S. Application Data

(60) Provisional application No. 60/915,547, filed on May 2, 2007.

(51) Int. Cl.
*G05F 1/613* (2006.01)
*G05F 1/00* (2006.01)
(52) U.S. Cl. .................. 323/224; 323/207; 323/284; 323/287
(58) Field of Classification Search .............. 323/224, 323/207, 283, 284, 287, 289, 290
See application file for complete search history.

(56) References Cited

U.S. PATENT DOCUMENTS

| | | | |
|---|---|---|---|
| 4,414,493 A | 11/1983 | Henrich | |
| 4,677,366 A | 6/1987 | Wilkinson et al. | |
| 4,797,633 A | 1/1989 | Humphrey | |
| 4,940,929 A | 7/1990 | Williams | |
| 4,973,919 A | 11/1990 | Allfather | |
| 5,278,490 A | 1/1994 | Smedley | |

| | | |
|---|---|---|
| 5,323,157 A | 6/1994 | Ledzius et al. |

(Continued)

FOREIGN PATENT DOCUMENTS

EP 0585789 A1 3/1994

(Continued)

OTHER PUBLICATIONS

"HV9931 Unity Power Factor LED Lamp Driver, Initial Release" 2005, Supertex Inc., Sunnyvale, CA USA.

(Continued)

*Primary Examiner*—Shawn Riley
(74) *Attorney, Agent, or Firm*—Hamilton & Terrile, LLP; Kent B. Chambers

(57) ABSTRACT

A method and system monitor gate charge characteristics of one or more field effect transistors in a switching power converter to detect an end of an inductor flyback time interval. The switching power converter includes a switch coupled to an inductor to control current flow in the inductor. When the switch turns OFF, a collapsing magnetic field causes the inductor current to decrease and the inductor voltage to reverse polarity. When the magnetic field completely collapses, the inductor current goes to zero. At the end of the inductor flyback time interval, a voltage is induced across a Miller capacitance of the switch. The voltage can be detected as a transient change in the gate voltage of the switch. A switch gate sensor detects the gate voltage change associated with the end of the inductor flyback time interval and provides a signal indicating an end of the inductor flyback time interval.

23 Claims, 8 Drawing Sheets

U.S. PATENT DOCUMENTS

| | | | |
|---|---|---|---|
| 5,359,180 A | 10/1994 | Park et al. |
| 5,477,481 A | 12/1995 | Kerth |
| 5,481,178 A | 1/1996 | Wilcox et al. |
| 5,565,761 A | 10/1996 | Hwang |
| 5,747,977 A | 5/1998 | Hwang |
| 5,783,909 A | 7/1998 | Hochstein |
| 5,963,086 A | 10/1999 | Hall |
| 5,994,885 A | 11/1999 | Wilcox et al. |
| 6,016,038 A | 1/2000 | Mueller et al. |
| 6,043,633 A | 3/2000 | Lev et al. |
| 6,072,969 A | 6/2000 | Yokomori et al. |
| 6,083,276 A | 7/2000 | Davidson et al. |
| 6,084,450 A | 7/2000 | Smith et al. |
| 6,150,774 A | 11/2000 | Mueller et al. |
| 6,211,626 B1 | 4/2001 | Lys et al. |
| 6,211,627 B1 | 4/2001 | Callahan |
| 6,229,271 B1 | 5/2001 | Liu |
| 6,246,183 B1 | 6/2001 | Buonavita |
| 6,259,614 B1 | 7/2001 | Ribarich et al. |
| 6,304,066 B1 | 10/2001 | Wilcox et al. |
| 6,304,473 B1 | 10/2001 | Telefus et al. |
| 6,344,811 B1 | 2/2002 | Melanson |
| 6,445,600 B2 | 9/2002 | Ben-Yaakov |
| 6,452,521 B1 | 9/2002 | Wang |
| 6,509,913 B2 | 1/2003 | Martin, Jr. et al. |
| 6,580,258 B2 | 6/2003 | Wilcox et al. |
| 6,583,550 B2 | 6/2003 | Iwasa et al. |
| 6,636,003 B2 | 10/2003 | Rahm et al. |
| 6,713,974 B2 | 3/2004 | Patchornik et al. |
| 6,727,832 B1 | 4/2004 | Melanson |
| 6,741,123 B1 | 5/2004 | Andersen et al. |
| 6,768,655 B1 | 7/2004 | Yang et al. |
| 6,781,351 B2 | 8/2004 | Mednik et al. |
| 6,788,011 B2 | 9/2004 | Mueller et al. |
| 6,806,659 B1 | 10/2004 | Mueller et al. |
| 6,839,247 B1 | 1/2005 | Yang |
| 6,860,628 B2 | 3/2005 | Robertson et al. |
| 6,870,325 B2 | 3/2005 | Bushell et al. |
| 6,882,552 B2 | 4/2005 | Telefus et al. |
| 6,888,322 B2 | 5/2005 | Dowling et al. |
| 6,933,706 B2 * | 8/2005 | Shih ........................... 323/222 |
| 6,940,733 B2 | 9/2005 | Schie et al. |
| 6,944,034 B1 | 9/2005 | Shytenberg et al. |
| 6,956,750 B1 | 10/2005 | Eason et al. |
| 6,967,448 B2 | 11/2005 | Morgan et al. |
| 6,970,503 B1 | 11/2005 | Kalb |
| 6,975,079 B2 | 12/2005 | Lys et al. |
| 7,064,498 B2 | 6/2006 | Dowling et al. |
| 7,064,531 B1 | 6/2006 | Zinn |
| 7,088,059 B2 | 8/2006 | McKinney et al. |
| 7,102,902 B1 | 9/2006 | Brown et al. |
| 7,109,791 B1 | 9/2006 | Epperson et al. |
| 7,135,824 B2 | 11/2006 | Lys et al. |
| 7,145,295 B1 | 12/2006 | Lee et al. |
| 7,161,816 B2 | 1/2007 | Shytenberg et al. |
| 7,183,957 B1 | 2/2007 | Melanson |
| 7,221,130 B2 | 5/2007 | Ribeiro et al. |
| 7,255,457 B2 | 8/2007 | Ducharme et al. |
| 7,266,001 B1 | 9/2007 | Notohamiprodjo et al. |
| 7,288,902 B1 | 10/2007 | Melanson |
| 7,292,013 B1 | 11/2007 | Chen et al. |
| 2002/0145041 A1 | 10/2002 | Muthu et al. |
| 2002/0166073 A1 | 11/2002 | Nguyen et al. |
| 2003/0095013 A1 | 5/2003 | Melanson et al. |
| 2003/0223255 A1 | 12/2003 | Ben-Yaakov |
| 2004/0085030 A1 | 5/2004 | Laflamme et al. |
| 2004/0085117 A1 | 5/2004 | Melbert et al. |
| 2004/0169477 A1 | 9/2004 | Yanai et al. |
| 2004/0227571 A1 | 11/2004 | Kuribayashi |
| 2004/0228116 A1 | 11/2004 | Miller et al. |
| 2004/0239262 A1 | 12/2004 | Ido et al. |
| 2005/0057237 A1 | 3/2005 | Clavel |
| 2005/0156770 A1 | 7/2005 | Melanson |
| 2005/0184895 A1 | 8/2005 | Petersen et al. |
| 2005/0253533 A1 | 11/2005 | Lys et al. |
| 2005/0275354 A1 | 12/2005 | Hausman, Jr. et al. |
| 2006/0022916 A1 | 2/2006 | Aiello |
| 2006/0023002 A1 | 2/2006 | Hara et al. |
| 2006/0125420 A1 | 6/2006 | Boone et al. |
| 2006/0226795 A1 | 10/2006 | Walter et al. |
| 2006/0261754 A1 | 11/2006 | Lee |
| 2007/0029946 A1 | 2/2007 | Yu et al. |
| 2007/0040512 A1 | 2/2007 | Jungwirth et al. |
| 2007/0053182 A1 | 3/2007 | Robertson |
| 2007/0103949 A1 | 5/2007 | Tsuruya |
| 2007/0182699 A1 | 8/2007 | Ha et al. |
| 2008/0174372 A1 | 7/2008 | Tucker et al. |
| 2008/0224635 A1 | 9/2008 | Hayes |

FOREIGN PATENT DOCUMENTS

| | | |
|---|---|---|
| EP | 0910168 A1 | 4/1999 |
| EP | 1014563 | 6/2000 |
| EP | 1164819 A | 12/2001 |
| EP | 1213823 A2 | 6/2002 |
| EP | 1528785 A | 5/2005 |
| WO | 01/97384 A | 12/2001 |
| WO | 0227944 | 4/2002 |
| WO | 02/091805 A2 | 11/2002 |
| WO | WO 2006/022107 A2 | 3/2006 |
| WO | 2006/067521 A | 6/2006 |
| WO | WO2006135584 | 12/2006 |
| WO | 2007/026170 A | 3/2007 |
| WO | 2007/079362 A | 7/2007 |

OTHER PUBLICATIONS

AN-H52 Application Note: "HV9931 Unity Power Factor LED Lamp Driver" Mar. 7, 2007, Supertex Inc., Sunnyvale, CA, USA.

Dustin Rand et al: "Issues, Models and Solutions for Triac Modulated Phase Dimming of LED Lamps" Power Electronics Specialists Conference, 2007. PESC 2007, IEEE, IEEE, P1, Jun. 1, 2007, pp. 1398-1404.

Spiazzi G et al: "Analysis of a High-Power-Factor Electronic Ballast for High Brightness Light Emitting Diodes" Power Electronics Specialists, 2005 IEEE 36th Conference on June 12, 2005, Piscatawa, NJ USA, IEEE, Jun. 12, 2005, pp. 1494-1499.

International Search Report PCT/US2008/062381 dated Feb. 5, 2008.

International Search Report PCT/US2008/056739 dated Dec. 3, 2008.

Written Opinion of the International Searching Authority PCT/US2008/062381 dated Feb. 5, 2008.

Ben-Yaakov et al, "The Dynamics of a PWM Boost Converter with Resistive Input" IEEE Transactions on Industrial Electronics, IEEE Service Center, Piscataway, NJ, USA, vol. 46, No. 3, Jun. 1, 1999.

International Search Report PCT/US2008/062398 dated Feb. 5, 2008.

Partial International Search PCT/US2008/062387 dated Feb. 5, 2008.

Noon, Jim "UC3855A/B High Performance Power Factor Preregulator", Texas Instruments, SLUA146A, May 1996, Revised Apr. 2004.

"High Performance Power Factor Preregulator", Unitrode Products from Texas Instruments, SLUS382B, Jun. 1998, Revised Oct. 2005.

International Search Report PCT/GB2006/003259 dated Jan. 12, 2007.

Written Opinion of the International Searching Authority PCT/US2008/056739.

International Search Report PCT/US2008/056606 dated Dec. 3, 2008.

Written Opinion of the International Searching Authority PCT/US2008/056606 dated Dec. 3, 2008.

International Search Report PCT/US2008/056608 dated Dec. 3, 2008.

Written Opinion of the International Searching Authority PCT/US2008/056608 dated Dec. 3, 2008.

International Search Report PCT/GB2005/050228 dated Mar. 14, 2006.

International Search PCT/US2008/062387 dated Jan. 10, 2008.

Data Sheet LT3496 Triple Output LED Driver, 2007, Linear Technology Corporation, Milpitas, CA.

News Release, Triple Output LED, LT3496.

Freescale Semiconductor, Inc., Dimmable Light Ballast with Power Factor Correction, Design Reference Manual, DRM067, Rev. 1, Dec. 2005.

J. Zhou et al., Novel Sampling Algorithm for DSP Controlled 2 kW PFC Converter, IEEE Transactions on Power Electronics, vol. 16, No. 2, Mar. 2001.

A. Prodic, Compensator Design and Stability Assessment for Fast Voltage Loops of Power Factor Correction Rectifiers, IEEE Transactions on Power Electronics, vol. 22, No. 5, Sep. 2007.

M. Brkovic et al., "Automatic Current Shaper with Fast Output Regulation and Soft-Switching," S.15.C Power Converters, Telecommunications Energy Conference, 1993.

Dallas Semiconductor, Maxim, "Charge-Pump and Step-Up DC-DC Converter Solutions for Powering White LEDs in Series or Parallel Connections," Apr. 23, 2002.

Freescale Semiconductor, AN3052, Implementing PFC Average Current Mode Control Using the MC9S12E128, Nov. 2005.

D. Maksimovic et al., "Switching Converters with Wide DC Conversion Range," Institute of Electrical and Electronic Engineer's (IEEE) Transactions on Power Electronics, Jan. 1991.

V. Nguyen et al., "Tracking Control of Buck Converter Using Sliding-Mode with Adaptive Hysteresis," Power Electronics Specialists Conference, 1995. PESC apos; 95 Record., 26th Annual IEEE vol. 2, Issue , Jun. 18-22, 1995 pp. 1086-1093.

S. Zhou et al., "A High Efficiency, Soft Switching DC-DC Converter with Adaptive Current-Ripple Control for Portable Applications," IEEE Transactions on Circuits and Systems—II: Express Briefs, vol. 53, No. 4, Apr. 2006.

K. Leung et al., "Use of State Trajectory Prediction in Hysteresis Control for Achieving Fast Transient Response of the Buck Converter," Circuits and Systems, 2003. ISCAS apos;03. Proceedings of the 2003 International Symposium, vol. 3, Issue , May 25-28, 2003 pp. III-439-III-442 vol. 3.

K. Leung et al., "Dynamic Hysteresis Band Control of the Buck Converter with Fast Transient Response," IEEE Transactions on Circuits and Systems—II: Express Briefs, vol. 52, No. 7, Jul. 2005.

Y. Ohno, Spectral Design Considerations for White LED Color Rendering, Final Manuscript, Optical Engineering, vol. 44, 111302 (2005).

S. Skogstad et al., A Proposed Stability Characterization and Verification Method for High-Order Single-Bit Delta-Sigma Modulators, Norchip Conference, Nov. 2006 http://folk.uio.no/sayskogs/pub/A_Proposed_Stability_Characterization.pdf.

J. Turchi, Four Key Steps to Design a Continuous Conduction Mode PFC Stage Using the NCP1653, ON Semiconductor, Publication Order No. AND184/D, Nov. 2004.

Megaman, D or S Dimming ESL, Product News, Mar. 15, 2007.

J. Qian et al., New Charge Pump Power-Factor-Correction Electronic Ballast with a Wide Range of Line Input Voltage, IEEE Transactions on Power Electronics, vol. 14, No. 1, Jan. 1999.

P. Green, A Ballast that can be Dimmed from a Domestic (Phase-Cut) Dimmer, IRPLCFL3 rev. b, International Rectifier, http://www.irf.com/technical-info/refdesigns/cfl-3.pdf, printed Mar. 24, 2007.

J. Qian et al., Charge Pump Power-Factor-Correction Technologies Part II: Ballast Applications, IEEE Transactions on Power Electronics, vol. 15, No. 1, Jan. 2000.

Chromacity Shifts in High-Power White LED Systems due to Different Dimming Methods, Solid-State Lighting, http://www.lrc.rpi.edu/programs/solidstate/completedProjects.asp?ID=76, printed May 3, 2007.

S. Chan et al., Design and Implementation of Dimmable Electronic Ballast Based on Integrated Inductor, IEEE Transactions on Power Electronics, vol. 22, No. 1, Jan. 2007.

M. Madigan et al., Integrated High-Quality Rectifier-Regulators, IEEE Transactions on Industrial Electronics, vol. 46, No. 4, Aug. 1999.

T. Wu et al., Single-Stage Electronic Ballast with Dimming Feature and Unity Power Factor, IEEE Transactions on Power Electronics, vol. 13, No. 3, May 1998.

F. Tao et al., "Single-Stage Power-Factor-Correction Electronic Ballast with a Wide Continuous Dimming Control for Fluorescent Lamps," IEEE Power Electronics Specialists Conference, vol. 2, 2001.

Azoteq, IQS17 Family, IQ Switch®—ProxSense™ Series, Touch Sensor, Load Control and User Interface, IQS17 Datasheet V2.00.doc, Jan. 2007.

C. Dilouie, Introducing the LED Driver, EC&M, Sep. 2004.

S. Lee et al., TRIAC Dimmable Ballast with Power Equalization, IEEE Transactions on Power Electronics, vol. 20, No. 6, Nov. 2005.

L. Gonthier et al., EN55015 Compliant 500W Dimmer with Low-Losses Symmetrical Switches, 2005 European Conference on Power Electronics and Applications, Sep. 2005.

Why Different Dimming Ranges? The Difference Between Measured and Perceived Light, http://www.lutron.com/ballast/pdf/LutronBallastpg3.pdf.

D. Hausman, Real-Time Illumination Stability Systems for Trailing-Edge (Reverse Phase Control) Dimmers, Technical White Paper, Lutron, version 1.0, Dec. 2004, http://www.lutron.com/technical_info/pdf/RTISS-TE.pdf.

Light Dimmer Circuits, www.epanorama.net/documents/lights/lightdimmer.html, printed Mar. 26, 2007.

Light Emitting Diode, http://en.wikipedia.org/wiki/Light-emitting_diode, printed Mar. 27, 2007.

Color Temperature, www.sizes.com/units/color_temperature.htm, printed Mar. 27, 2007.

S. Lee et al., A Novel Electrode Power Profiler for Dimmable Ballasts Using DC Link Voltage and Switching Frequency Controls, IEEE Transactions on Power Electronics, vol. 19, No. 3, May 2004.

Y. Ji et al., Compatibility Testing of Fluorescent Lamp and Ballast Systems, IEEE Transactions on Industry Applications, vol. 35, No. 6, Nov./Dec. 1999.

National Lighting Product Information Program, Specifier Reports, "Dimming Electronic Ballasts," vol. 7, No. 3, Oct. 1999.

Supertex Inc., Buck-based LED Drivers Using the HV9910B, Application Note AN-H48, Dec. 28, 2007.

D. Rand et al., Issues, Models and Solutions for Triac Modulated Phase Dimming of LED Lamps, Power Electronics Specialists Conference, 2007.

Supertex Inc., HV9931 Unity Power Factor LED Lamp Driver, Application Note AN-H52, Mar. 7, 2007.

Supertex Inc., 56W Off-line LED Driver, 120VAC with PFC, 160V, 350mA Load, Dimmer Switch Compatible, DN-H05, Feb. 2007.

ST Microelectronics, Power Factor Corrector L6561, Jun. 2004.

Fairchild Semiconductor, Application Note 42047 Power Factor Correction (PFC) Basics, Rev. 0.9.0 Aug. 19, 2004.

M. Radecker et al., Application of Single-Transistor Smart-Power IC for Fluorescent Lamp Ballast, Thirty-Fourth Annual Industry Applications Conference IEEE, vol. 1, Oct. 3-7, 1999.

M. Rico-Secades et al., Low Cost Electronic Ballast for a 36-W Fluorescent Lamp Based on a Current-Mode-Controlled Boost Inverter for a 120-V DC Bus Power Distribution, IEEE Transactions on Power Electronics, vol. 21, No. 4, Jul. 2006.

Fairchild Semiconductor, FAN4800, Low Start-up Current PFC/PWM Controller Combos, Nov. 2006.

Fairchild Semiconductor, FAN4810, Power Factor Correction Controller, Sep. 24, 2003.

Fairchild Semiconductor, FAN4822, ZVS Average Current PFC Controller, Aug. 10, 2001.

Fairchild Semiconductor, FAN7527B, Power Factor Correction Controller, 2003.

Fairchild Semiconductor, ML4821, Power Factor Controller, Jun. 19, 2001

Freescale Semiconductor, AN1965, Design of Indirect Power Factor Correction Using 56F800/E, Jul. 2005.

International Search Report for PCT/US2008/051072, mailed Jun. 4, 2008.

Infineon, CCM-PFC Standalone Power Factor Correction (PFC) Controller in Continuous Conduction Mode (CCM), Version 2.1, Feb. 6, 2007.
International Rectifier, IRAC1150-300W Demo Board, User's Guide, Rev 3.0, Aug. 2, 2005.
International Rectifier, Application Note AN-1077,PFC Converter Design with IR1150 One Cycle Control IC, rev. 2.3, Jun. 2005.
International Rectifier, Data Sheet PD60230 revC, Feb. 5, 2007.
Lu et al., International Rectifier, Bridgeless PFC Implementation Using One Cycle Control Technique, 2005.
Linear Technology, LT1248, Power Factor Controller, Apr. 20, 2007.
ON Semiconductor, AND8123/D, Power Factor Correction Stages Operating in Critical Conduction Mode, Sep. 2003.
ON Semiconductor, MC33260, GreenLine Compact Power Factor Controller: Innovative Circuit for Cost Effective Solutions, Sep. 2005.
ON Semiconductor, NCP1605, Enhanced, High Voltage and Efficient Standby Mode, Power Factor Controller, Feb. 2007.
ON Semconductor, NCP1606, Cost Effective Power Factor Controller, Mar. 2007.
ON Semiconductor, NCP1654, Product Review, Power Factor Controller for Compact and Robust, Continuous Conduction Mode Pre-Converters, Mar. 2007.
Philips, Application Note, 90W Resonant SMPS with TEA1610 SwingChip, AN99011, 1999.
NXP, TEA1750, GreenChip III SMPS control IC Product Data Sheet, Apr. 6, 2007.
Renesas, HA16174P/FP, Power Factor Correction Controller IC, Jan. 6, 2006.
Renesas Technology Releases Industry's First Critical-Conduction-Mode Power Factor Correction Control IC Implenenting Interleaved Operation, Dec. 18, 2006.
Renesas, Application Note R2A20111 EVB, PFC Control IC R2A20111 Evaluation Board, Feb. 2007.
STMicroelectronics, L6563, Advanced Transition-Mode PFC Controller, Mar. 2007.
Texas Instruments, Application Note SLUA321, Startup Current Transient of the Leading Edge Triggered PFC Controllers, Jul. 2004.
Texas Instruments, Application Report, SLUA309A, Avoiding Audible Noise at Light Loads when using Leading Edge Triggered PFC Converters, Sep. 2004.
Texas Instruments, Application Report SLUA369B, 350-W, Two-Phase Interleaved PFC Pre-Regulator Design Review, Mar. 2007.
UNITRODE, High Power-Factor Preregulator, Oct. 1994.
Texas Instruments, Transition Mode PFC Controller, SLUS515D, Jul. 2005.
Unitrode Products From Texas Instruments, Programmable Output Power Factor Preregulator, Dec. 2004.
Unitrode Products From Texas Instruments, High Performance Power Factor Preregulator, Oct. 2005.
Texas Instruments, UCC3817 BiCMOS Power Factor Preregulator Evaluation Board User's Guide, Nov. 2002.
Unitrode, L. Balogh, Design Note UC3854A/B and UC3855A/B Provide Power Limiting with Sinusoidal Input Current for PFC Front Ends, SLUA196A, Nov. 2001.
A. Silva De Morais et al., A High Power Factor Ballast Using a Single Switch with Both Power Stages Integrated, IEEE Transactions on Power Electronics, vol. 21, No. 2, Mar. 2006.
M. Ponce et al., High-Efficient Integrated Electronic Ballast for Compact Fluorescent Lamps, IEEE Transactions on Power Electronics, vol. 21, No. 2, Mar. 2006.
A. R. Seidel et al., A Practical Comparison Among High-Power-Factor Electronic Ballasts with Similar Ideas, IEEE Transactions on Industry Applications, vol. 41, No. 6, Nov.-Dec. 2005.
F. T. Wakabayashi et al., An Improved Design Procedure for LCC Resonant Filter of Dimmable Electronic Ballasts for Fluorescent Lamps, Based on Lamp Model, IEEE Transactions on Power Electronics, vol. 20, No. 2, Sep. 2005.
J. A. Vilela Jr. et al., An Electronic Ballast with High Power Factor and Low Voltage Stress, IEEE Transactions on Industry Applications, vol. 41, No. 4, Jul./Aug. 2005.

S. T.S. Lee et al., Use of Saturable Inductor to Improve the Dimming Characteristics of Frequency-Controlled Dimmable Electronic Ballasts, IEEE Transactions on Power Electronics, vol. 19, No. 6, Nov. 2004.
M. K. Kazimierczuk et al., Electronic Ballast for Fluorescent Lamps, IEEETransactions on Power Electronics, vol. 8, No. 4, Oct. 1993.
S. Ben-Yaakov et al., Statics and Dynamics of Fluorescent Lamps Operating at High Frequency: Modeling and Simulation, IEEE Transactions on Industry Applications, vol. 38, No. 6, Nov.-Dec. 2002.
H. L. Cheng et al., A Novel Single-Stage High-Power-Factor Electronic Ballast with Symmetrical Topology, IEEE Transactions on Power Electronics, vol. 50, No. 4, Aug. 2003.
J.W.F. Dorleijn et al., Standardisation of the Static Resistances of Fluorescent Lamp Cathodes and New Data for Preheating, Industry Applications Conference, vol. 1, Oct. 13-18, 2002.
Q. Li et al., An Analysis of the ZVS Two-Inductor Boost Converter under Variable Frequency Operation, IEEE Transactions on Power Electronics, vol. 22, No. 1, Jan. 2007.
H. Peng et al., Modeling of Quantization Effects in Digitally Controlled DC-DC Converters, IEEE Transactions on Power Electronics, vol. 22, No. 1, Jan. 2007.
G. Yao et al., Soft Switching Circuit for Interleaved Boost Converters, IEEE Transactions on Power Electronics, vol. 22, No. 1, Jan. 2007.
C. M. De Oliviera Stein et al., A ZCT Auxiliary Communication Circuit for Interleaved Boost Converters Operating in Critical Conduction Mode, IEEE Transactions on Power Electronics, vol. 17, No. 6, Nov. 2002.
W. Zhang et al., A New Duty Cycle Control Strategy for Power Factor Correction and FPGA Implementation, IEEE Transactions on Power Electronics, vol. 21, No. 6, Nov. 2006.
H. Wu et al., Single Phase Three-Level Power Factor Correction Circuit with Passive Lossless Snubber, IEEE Transactions on Power Electronics, vol. 17, No. 2, Mar. 2006.
O. Garcia et al., High Efficiency PFC Converter to Meet EN61000-3-2 and A14, Proceedings of the 2002 IEEE International Symposium on Industrial Electronics, vol. 3, 2002.
P. Lee et al., Steady-State Analysis of an Interleaved Boost Converter with Coupled Inductors, IEEE Transactions on Industrial Electronics, vol. 47, No. 4, Aug. 2000.
D.K.W. Cheng et al., A New Improved Boost Converter with Ripple Free Input Current Using Coupled Inductors, Power Electronics and Variable Speed Drives, Sep. 21-23, 1998.
B.A. Miwa et al., High Efficiency Power Factor Correction Using Interleaved Techniques, Applied Power Electronics, Seventh Annual Conference Proceedings, Feb. 23-27, 1992.
Z. Lai et al., A Family of Power-Factor-Correction Controllers, Twelth Annual Applied Power Electronics Conference and Exposition, vol. 1, Feb. 23-27, 1997.
L. Balogh et al., Power-Factor Correction with Interleaved Boost Converters in Continuous-Inductor-Current Mode, Eighth Annual Applied Power Electronics Conference and Exposition, 1993. APEC '93. Conference Proceedings, Mar. 7-11, 1993.
Fairchild Semiconductor, Application Note 42030, Theory and Application of the ML4821 Average Current Mode PFC Controller, Oct. 25, 2000.
Unitrode Products From Texas Instruments, BiCMOS Power Factor Preregulator, Feb. 2006.
D. Hausman, Lutron, RTISS-TE Operation, Real-Time Illumination Stability Systems for Trailing-Edge (Reverse Phase Control) Dimmers, v. 1.0 Dec. 2004.
International Rectifier, Data Sheet No. PD60230 revC, IR1150(S)(PbF), uPFC One Cycle Control PFC IC Feb. 5, 2007.
Texas Instruments, Application Report SLUA308, UCC3817 Current Sense Transformer Evaluation, Feb. 2004.
Texas Instruments, Application Report SPRA902A, Average Current Mode Controlled Power Factor Correctiom Converter using TMS320LF2407A, Jul. 2005.
Unitrode, Design Note DN-39E, Optimizing Performance in UC3854 Power Factor Correction Applications, Nov. 1994.
Fairchild Semiconductor, Application Note 42030, Theory and Application of the ML4821 Average Currrent Mode PFC Controller, Aug. 1997.

Fairchild Semiconductor, Application Note AN4121, Design of Power Factor Correction Circuit Using FAN7527B, Rev.1.0.1, May 30, 2002.
Fairchild Semiconductor, Application Note 6004, 500W Power-Factor-Corrected (PFC) Converter Design with FAN4810, Rev. 1.0.1, Oct. 31, 2003.
Fairchild Semiconductor, FAN4822, ZVA Average Current PFC Controller, Rev. 1.0.1 Aug. 10, 2001.
Fairchild Semiconductor, ML4821, Power Factor Controller, Rev. 1.0.2, Jun. 19, 2001.
Fairchild Semiconductor, ML4812, Power Factor Controller, Rev. 1.0.4, May 31, 2001.
Linear Technology, 100 Watt LED Driver, undated.
Fairchild Semiconductor, FAN7544, Simple Ballast Controller, Rev. 1.0.0.
Fairchild Semiconductor, FAN7532, Ballast Controller, Rev. 1.0.2.
Fairchild Semiconductor, FAN7711, Ballast Control IC, Rev. 1.0.2.
Fairchild Semiconductor, KA7541, Simple Ballast Controller, Rev. 1.0.3.
ST Microelectronics, L6574, CFL/TL Ballast Driver Preheat and Dimming, Sep. 2003.
ST Microelectronics, AN993, Application Note, Electronic Ballast with PFC Using L6574 and L6561, May 2004.
International Search Report and Written Opinion for PCT/US2008/062384 dated Jan. 14, 2008.
S. Dunlap et al., Design of Delta-Sigma Modulated Switching Power Supply, Circuits & Systems, Proceedings of the 1998 IEEE International Symposium, 1998.
Power Integrations, Inc., "TOP200-4/14 TOPSwitch Family Three-terminal Off-line PWM Switch", XP-002524650, Jul. 1996, Sunnyvale, California.
Texas Instruments, SLOS318F, "High-Speed, Low Noise, Fully-Differential I/O Amplifiers," THS4130 and THS4131, US, Jan. 2006.
International Search Report and Written Opinion, PCT US20080062387, dated Feb. 5, 2008.
International Search Report and Written Opinion, PCT US200900032358, dated Jan. 29, 2009.
Hirota, Atsushi et al., "Analysis of Single Switch Delta-Sigma Modulated Pulse Space Modulation PFC Converter Effectively Using Switching Power Device," IEEE, US, 2002.
Prodic, Aleksandar, "Digital Controller for High-Frequency Rectifiers with Power Factor Correction Suitable for On-Chip Implementation," IEEE, US, 2007.
International Search Report and Written Opinion, PCT US20080062378, dated Feb. 5, 2008.
International Search Report and Written Opinion, PCT US20090032351, dated Jan. 29, 2009.
Erickson, Robert W. et al., "Fundamentals of Power Electronics," Second Edition, Chapter 6, Boulder, CO, 2001.
Allegro Microsystems, A1442, "Low Voltage Full Bridge Brushless DC Motor Driver with Hall Commutation and Soft-Switching, and Reverse Battery, Shoft Circuit, and Thermal Shutdown Protection," Worcester MA, 2009.
Texas Instruments, SLUS828B, "8-Pin Continuous Conduction Mode (CCM) PFC Controller", UCC28019A, US, revised Apr. 2009.
Analog Devices, "120 kHz Bandwidth, Low Distortion, Isolation Amplifier", AD215, Norwood, MA, 1996.
Burr-Brown, ISO120 and ISO121, "Precision Los Cost Isolation Amplifier," Tucson AZ, Mar. 1992.
Burr-Brown, ISO130, "High IMR, Low Cost Isolation Amplifier," SBOS220, US, Oct. 2001.
International Search Report and Written Report PCT US20080062428 dated Feb. 5, 2008.
Prodic, A. et al, "Dead Zone Digital Controller for Improved Dynamic Response of Power Factor Preregulators," IEEE, 2003.
"HV9931 Unity Power Factor LED Lamp Driver, Initial Release", Supertex Inc., Sunnyvale, CA USA 2005.
Written Opinion of the International Searching Authority PCT/US2008/056739 dated Dec. 3, 2008.
Data Sheet LT3496 Triple Output LED Driver, Linear Technology Corporation, Milpitas, CA 2007.
Linear Technology, News Release,Triple Output LED, LT3496, Linear Technology, Milpitas, CA, May 24, 2007.

* cited by examiner

US 7,746,043 B2

INDUCTOR FLYBACK DETECTION USING SWITCH GATE CHANGE CHARACTERISTIC DETECTION

CROSS-REFERENCE TO RELATED APPLICATION

This application claims the benefit under 35 U.S.C. §119(e) and 37 C.F.R. §1.78 of U.S. Provisional Application No. 60/915,547, filed May 2, 2007, and entitled "Power Factor Correction (PFC) Controller Apparatuses and Methods," and is incorporated by reference in its entirety.

BACKGROUND OF THE INVENTION

1. Field of the Invention

The present invention relates in general to the field of signal processing, and, more specifically, to a system and method with inductor flyback detection using switch gate charge characteristic detection.

2. Description of the Related Art

Switching power converters, such as switching power supplies, switch mode converters, switch mode transformers, and switching amplifiers, control power output using one or more switches. Often the switching power converters include inductors. The inductors are initially charged with an inductor current that induces a magnetic field in the inductor and a voltage across the inductor. The voltage across the inductor opposes the inductor current. When the inductor current is interrupted, for example, by opening a switch, a magnetic field created by the inductor current begins to collapse. The collapsing magnetic field causes the inductor current to ramp-down, and the inductor voltage reverses. The reversed inductor voltage is commonly referred to as a "flyback" voltage. The time during which the inductor current begins ramping down until it stops decreasing is referred to as the inductor flyback time interval. The switching power converter operates in discontinuous current mode if the switching power converter allows the induced magnetic field to completely collapse and, thus, allows the inductor current to reach zero (0) amps. The switching power converter operates in continuous current mode if the switching power converter begins increasing the inductor current before the induced magnetic field completely collapses.

FIG. 1 depicts a power control system 100 that utilizes an inductor 110. The inductor 110 generates an inductor current when switch 108 is nonconductive, i.e. is "OFF". The power control system 100 includes a switching power converter 102. The switching power converter 102 performs power factor correction and provides regulated voltage power to load 112. Voltage source 101 supplies an alternating current (AC) input voltage $V_{in}(t)$ to a full, diode bridge rectifier 103. The voltage source 101 is, for example, a public utility, and the AC voltage $V_{in}(t)$ is, for example, a 60 Hz/110 V line voltage in the United States or a 50 Hz/220 V line voltage in Europe. The rectifier 103 rectifies the input voltage $V_{in}(t)$ and supplies a rectified, time-varying, line input voltage $V_x(t)$ to the switching power converter 102.

The switch 108 of switching power converter 102 regulates the transfer of energy from the line input voltage $V_x(t)$, through inductor 110, to capacitor 106. The inductor current $i_L$ ramps 'up' (i.e. increases) when the switch 108 conducts, i.e. is "ON". Switch 108 is a field effect transistor (FET). Switch 108 is depicted as an n-channel device but can also be a p-channel device. The inductor current $i_L$ ramps down when switch 108 is OFF, and supplies inductor current $i_L$ to recharge capacitor 106. In at least one embodiment, the switching power converter 102 operates in discontinuous current mode, i.e. the inductor current $i_L$ ramp up time plus the inductor flyback time interval is less than the period of switch 108. Capacitor 106 supplies stored energy to load 112 while the switch 108 conducts. The capacitor 106 is sufficiently large so as to maintain a substantially constant output voltage $V_c(t)$, as established by a power factor correction (PFC) and output voltage controller 114 (as discussed in more detail below). The output voltage $V_c(t)$ remains substantially constant during constant load conditions. However, as load conditions change, the output voltage $V_c(t)$ changes. The PFC and output voltage controller 114 responds to the changes in $V_c(t)$ and adjusts the control signal $CS_0$ to maintain a substantially constant output voltage as quickly as possible. The PFC and output voltage controller 114 includes a small capacitor 115 to filter any high frequency signals from the line input voltage $V_x(t)$.

The power control system 100 also includes a PFC and output voltage controller 114 to control the switch 108 and, thus control power factor correction and regulate output power of the switching power converter 102. The goal of power factor correction technology is to make the switching power converter 102 appear resistive to the voltage source 101. Thus, the PFC and output voltage controller 114 attempts to control the inductor current $i_L$ so that the average inductor current $i_L$ is linearly and directly related to the line input voltage $V_x(t)$. Prodić, *Compensator Design and Stability Assessment for Fast Voltage Loops of Power Factor Correction Rectifiers*, IEEE Transactions on Power Electronics, Vol. 22, No. 5, September 2007, pp. 1719-1729 (referred to herein as "Prodić"), describes an example of PFC and output voltage controller 114. The PFC and output voltage controller 114 supplies a pulse width modified (PWM) control signal $CS_0$ to control the conductivity of switch 108. In at least one embodiment, switch 108 is a field effect transistor (FET), and control signal $CS_0$ is the gate voltage of switch 108. The values of the pulse width and duty cycle of control signal $CS_o$ depend on two feedback signals, namely, the line input voltage $V_x(t)$ and the capacitor voltage/output voltage $V_c(t)$.

PFC and output voltage controller 114 receives two feedback signals, the line input voltage $V_x(t)$ and the output voltage $V_c(t)$, via a wide bandwidth current loop 116 and a slower voltage loop 118. The current loop 116 operates at a frequency $f_c$ that is sufficient to allow the PFC and output controller 114 to respond to changes in the line input voltage $V_x(t)$ and cause the inductor current $i_L$ to track the line input voltage to provide power factor correction. The current loop frequency is generally set to a value between 20 kHz and 150 kHz. The voltage loop 118 operates at a much slower frequency $f_v$, typically 10-20 Hz. The capacitor voltage $V_c(t)$ includes a ripple component having a frequency equal to twice the frequency of input voltage $V_{in}(t)$, e.g. 120 Hz. Thus, by operating at 10-20 Hz, the voltage loop 118 functions as a low pass filter to filter the ripple component.

FIG. 2 depicts a class D amplifier 200, which represents another embodiment of a switching power converter. The class D amplifier 200 includes a controller 202 to generate respective control signals $CS_0$ and $CS_1$. Switches 208 and 210 are n-channel FETs but can also be p-channel devices. Control signals $CS_0$ and $CS_1$ charge and discharge the respective gates 204 and 206 of switches 208 and 210. When control signals $CS_0$ and $CS_1$ charge the respective gates 204 and 206, the respective gate voltages $V_{g0}$ and $V_{g1}$ increase and cause switches 208 and 210 to turn ON. When control signals $CS_0$ and $CS_1$ discharge respective gates 204 and 206, the respective gate voltages $V_{g0}$ and $V_{g1}$ decrease and cause switches 208 and 210 to turn OFF. Control signals $CS_0$ and $CS_1$ control switches 208 and 210 in a 'non-overlapping' manner so that switches 208 and 210 are not ON at the same time.

When switch 208 turns ON and switch 210 is OFF, an inductor current is supplied by voltage source V+ and generates a magnetic field in the inductor 212. The magnetic field induces a voltage across the inductor that opposes the inductor current. When switch 208 turns OFF and switch 210 turns ON, an inductor current is supplied by voltage source V−. The inductor current induces a reverse voltage across the inductor 212. Capacitor 214 provides a low pass filtering function and stabilizes the output voltage $V_{out}$. The class D amplifier 200 provides power to load 216, such as one or more audio speakers.

Detecting a time at which the inductor flyback time ends ("inductor flyback end time") can be useful, for example, to control switch timing and ensuring a device operates in continuous current mode or discontinuous current mode. However, detection of the inductor flyback end time can be difficult and/or costly.

SUMMARY OF THE INVENTION

In one embodiment of the present invention, an apparatus to detect an end of an inductor flyback time interval of a switching power converter, wherein the switching power converter includes an inductor to couple to an input voltage node and a field effect transistor (FET) switch coupled to the inductor, includes a switch gate sensor to couple to a gate of the switch, wherein during operation of the switch gate sensor. The switch gate sensor is configured to detect a charge characteristic on a gate of the switch associated with an end of the inductor flyback time interval and generate a switch gate sensor signal indicating an end of the inductor flyback time interval.

In another embodiment of the present invention, a method to detect an end of an inductor flyback time interval of a switching power converter, wherein the switching power converter includes an inductor to couple to an input voltage node and a field effect transistor (FET) switch coupled to the inductor, includes detecting a charge characteristic on a gate of the switch associated with an end of the inductor flyback time interval. The method further includes generating a switch gate sensor signal indicating an end of the inductor flyback time interval.

In a further embodiment of the present invention, an apparatus to detect an end of an inductor flyback time interval of a switching power converter, wherein the switching power converter includes an inductor to couple to an input voltage node and a field effect transistor (FET) switch coupled to the inductor, includes means for detecting a charge characteristic on a gate of the switch associated with an end of the inductor flyback time interval. The apparatus further includes means, coupled to the means for detecting, for generating a switch gate sensor signal indicating an end of the inductor flyback time interval.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A method and system monitor gate charge characteristics of one or more field effect transistors in a switching power converter to detect an end of an inductor flyback time interval. The switching power converter includes a switch coupled directly or indirectly to an inductor. The conductive state of the switch controls current flow in the inductor. When the switch turns OFF, i.e. is nonconductive, a collapsing magnetic field causes the inductor current to decrease and the inductor voltage to reverse polarity. When the magnetic field completely collapses, the inductor current goes to zero. A parasitic "Miller" capacitance exists between a gate and source of the switch. At the end of the inductor flyback time interval, a voltage is induced across the Miller capacitance, and the voltage can be detected as a transient change in the gate voltage of the switch. A switch gate sensor detects the gate voltage change associated with the end of the inductor flyback time interval and provides a signal indicating an end of the inductor flyback time interval. The end of the inductor flyback time interval can be used to, for example, detect an input voltage, an output voltage, or both from a switching power converter, which can in turn be used to determine a control signal to control the switching power converter. In at least one embodiment, detecting the inductor flyback end time from the gate voltage can reduce terminal counts in PFC and output voltage controllers or permit reallocation of terminals.

Figure 1:
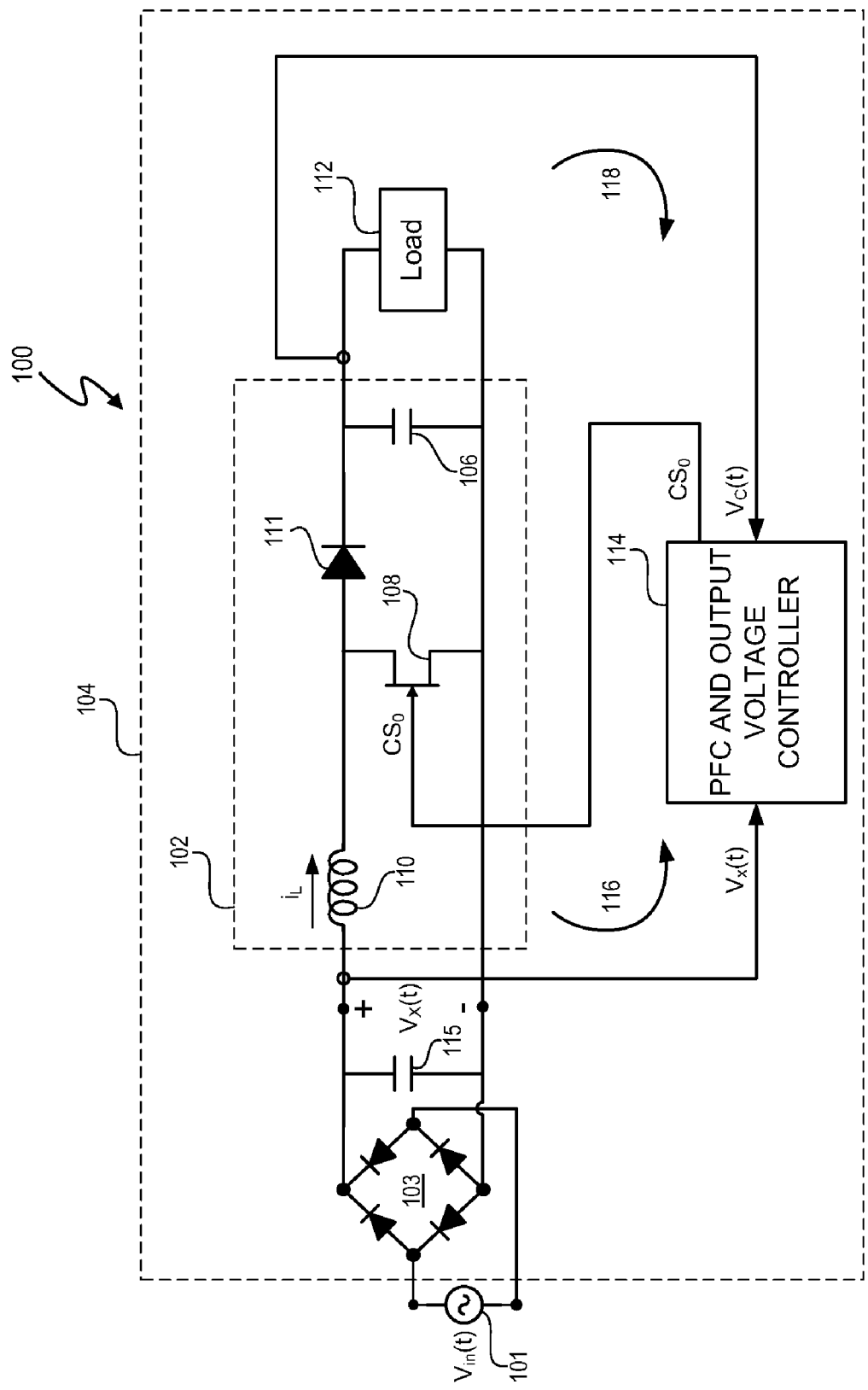
FIG. 1 (labeled prior art) depicts a power control system with power factor correction and output voltage regulation.
Figure 2:
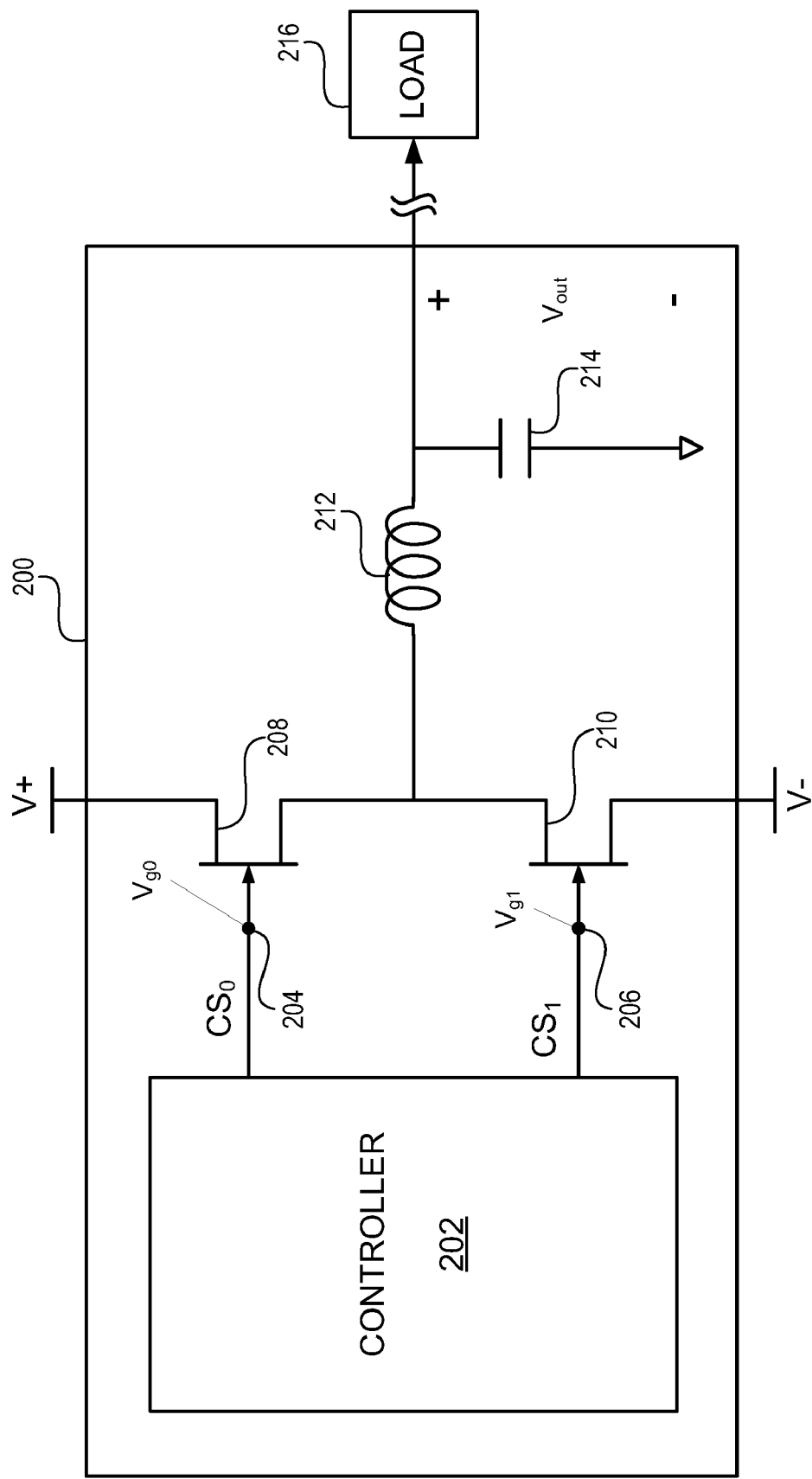
FIG. 2 (labeled prior art) depicts a class D amplifier.
Figure 3:
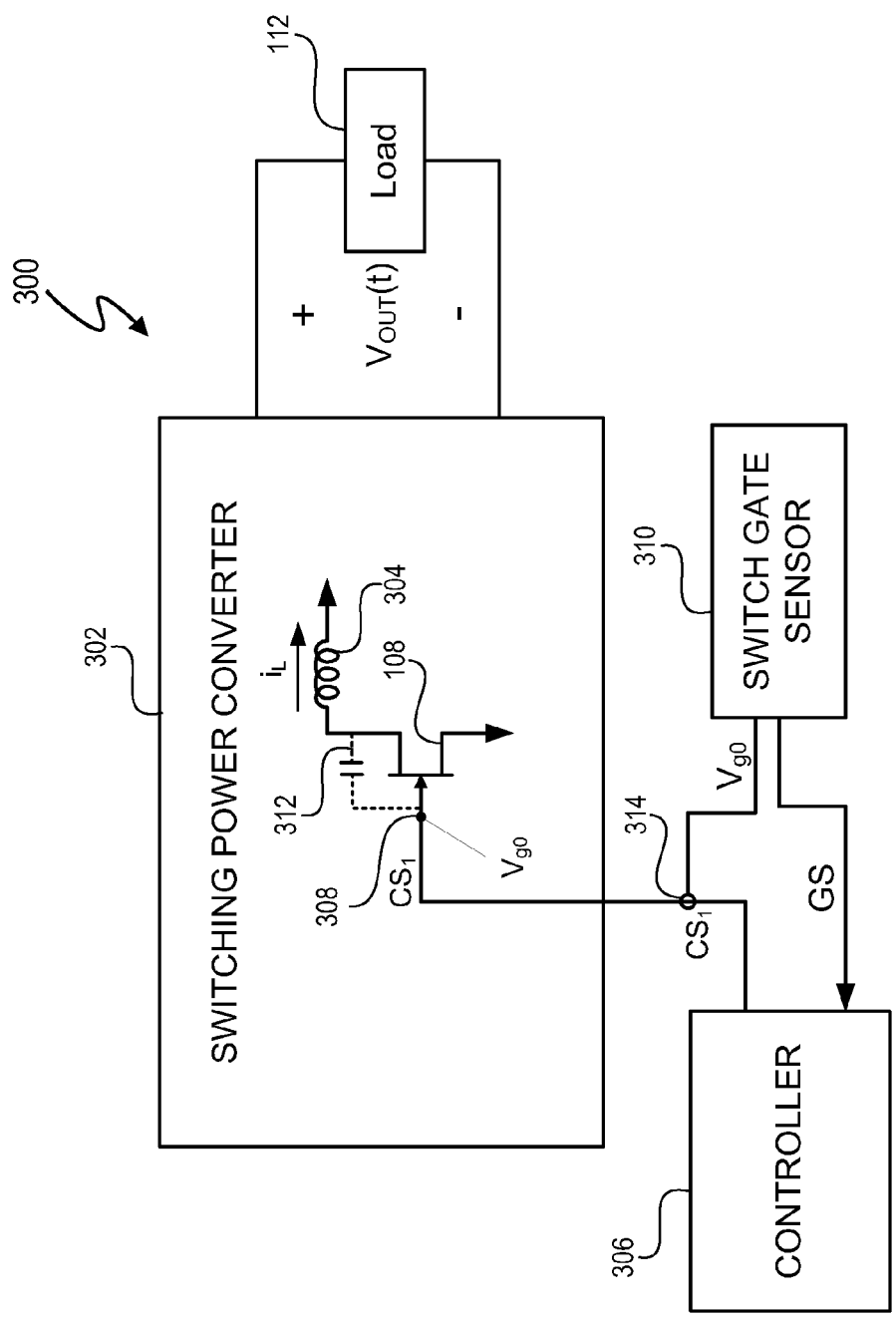
FIG. 3 depicts a switching power converter with a switch gate sensor.

FIG. 3 depicts a power control system 300. The power control system 300 includes a switching power converter 302. The switching power converter 302 can be any switching power converter 302, such as a switching power supply, a switch mode converter, a switch mode transformer, or a switching amplifier. The switching power converter 302 includes a switch 108 to control the inductor current $i_L$. FIG. 3 depicts an exemplary connection configuration between switch 108 and inductor 304. The particular connection configuration between switch 108 and inductor 304 is a design choice.

A controller 306 generates a control signal $CS_1$ that charges and discharges the gate of switch 108. When control signal $CS_1$ charges gate 308, the gate voltage $V_{g0}$ increases and causes switch 108 to turn ON. When control signal $CS_1$ discharges gate 308, the gate voltage $V_{g0}$ decreases and causes switch 108 to turn OFF. The conductive state of switch 108 controls the inductor current $i_L$. In at least one embodiment, when switch 108 conducts, the inductor current $i_L$ creates a magnetic field associated with inductor 304 and induces an inductor voltage that opposes the inductor current $i_L$. When switch 108 turns OFF, the inductor current decreases as the magnetic field collapses, and the voltage across the inductor concurrently reverses polarity. The time interval during which the inductor current decreases is referred to as the "inductor flyback time interval".

A switch gate sensor 310 detects changes in the charge on gate 308. The changes in the gate 308 charge include, in at least one embodiment, transient charge fluctuations on the gate 308 at the end of the inductor flyback time. The switch 108 has a parasitic gate-to-drain "Miller" capacitance 312 between the gate and source of switch 108. At the end of the inductor flyback time interval, a transient gate charge fluctuation associated with the Miller capacitance 312 occurs on the gate of switch 108. The switch gate sensor 310 includes a probe 314 coupled to the gate of switch 108 to allow the switch gate sensor 310 to detect the charge fluctuations on the switch 108 gate. In at least one embodiment, the gate charge fluctuations can be detected as a change in the gate voltage $V_{g0}$ at the end of the inductor flyback time interval. In at least one embodiment, the gate voltage $V_{g0}$ is at or near a common voltage during the inductor flyback time interval and decreases below the common voltage at the end of the inductor flyback time interval.

The switch gate sensor 310 generates a switch gate sensor signal GS upon detection of the gate charge fluctuations on the gate of switch 108 and provides the signal GS to the controller 306. The controller 306 receives the gate sensor signal GS and can use the detection of the inductor flyback time interval end as indicated by the gate sensor signal GS to, for example, determine the duration of the inductor flyback time interval and determine when to sample one or more feedback signals (not shown) from the switching power converter to the controller as, for example, discussed in commonly assigned U.S. patent application entitled "Power Factor Correction Controller With Feedback Reduction", inventor John L. Melanson, assignee Cirrus Logic, Inc., and Ser. No. 11/967,271 ("Melanson I") and U.S. patent application entitled "Power Factor Correction Controller With Switch Node Feedback", inventor John L. Melanson, assignee Cirrus Logic, Inc., and Ser. No. 11/967,272 ("Melanson II"). Melanson I and Melanson II are incorporated herein by reference in their entireties.

In at least one embodiment, the switch gate sensor 310 is incorporated within an integrated circuit with the controller 306. By incorporating the switch gate sensor 310 in the same integrated circuit, one or more additional pins that would otherwise be used to detect the end of the inductor flyback interval can be eliminated or reallocated. In at least one embodiment, additional switch gate sensors are included in power control system 300 to detect additional gate charge fluctuations associated with other switches.

Figure 4:
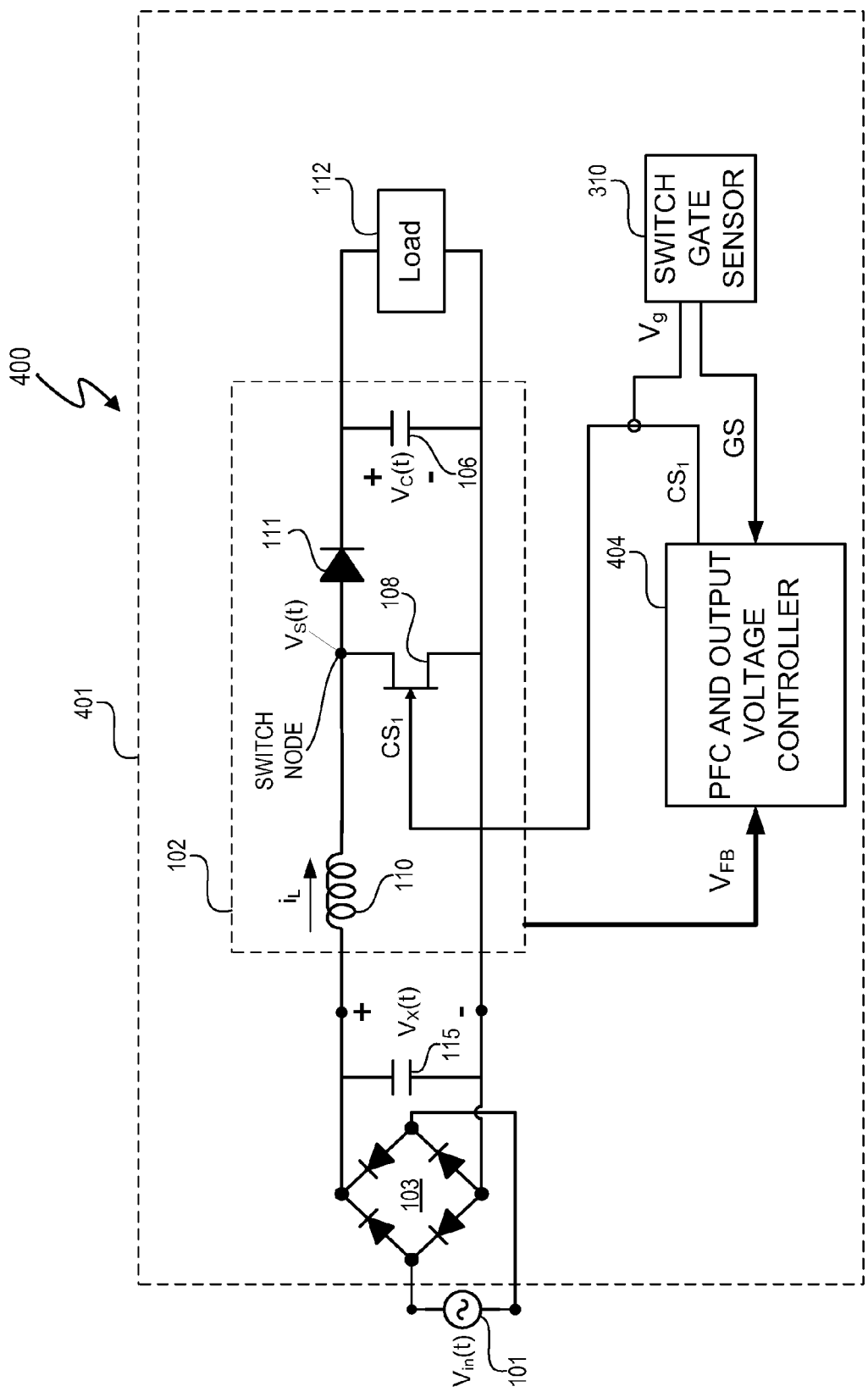
FIG. 4 depicts a power control system with a switching power converter and a switch gate sensor.

FIG. 4 depicts power control system 400 having a power factor correction (PFC) and output voltage controller 404 to control power factor correction and output voltage regulation of the switching power converter 102. Power control system 400 includes switch gate sensor 310 to detect charge fluctuations on the gate of switch 108. The switch gate sensor 310 provides the switch gate sensor signal GS to PFC and output voltage controller 404. In at least some embodiments, the PFC and output voltage controller 404 represents an embodiment of the PFC and output voltage controllers described in Melanson I and Melanson II, and PFC and output voltage controller 404 utilizes the switch gate sensor signal GS and the feedback signal(s) $V_{FB}$ to generate the control signal $CS_1$. The PFC and output voltage controller 404 can utilize a programmable pulse width and period control processor. An exemplary programmable pulse width and period control processor is described in U.S. patent application entitled "Programmable Power Control System", inventor John L. Melanson, assignee Cirrus Logic, Inc., and Ser. No. 11/967,275, which is incorporated herein by reference in its entirety.

Figure 5:
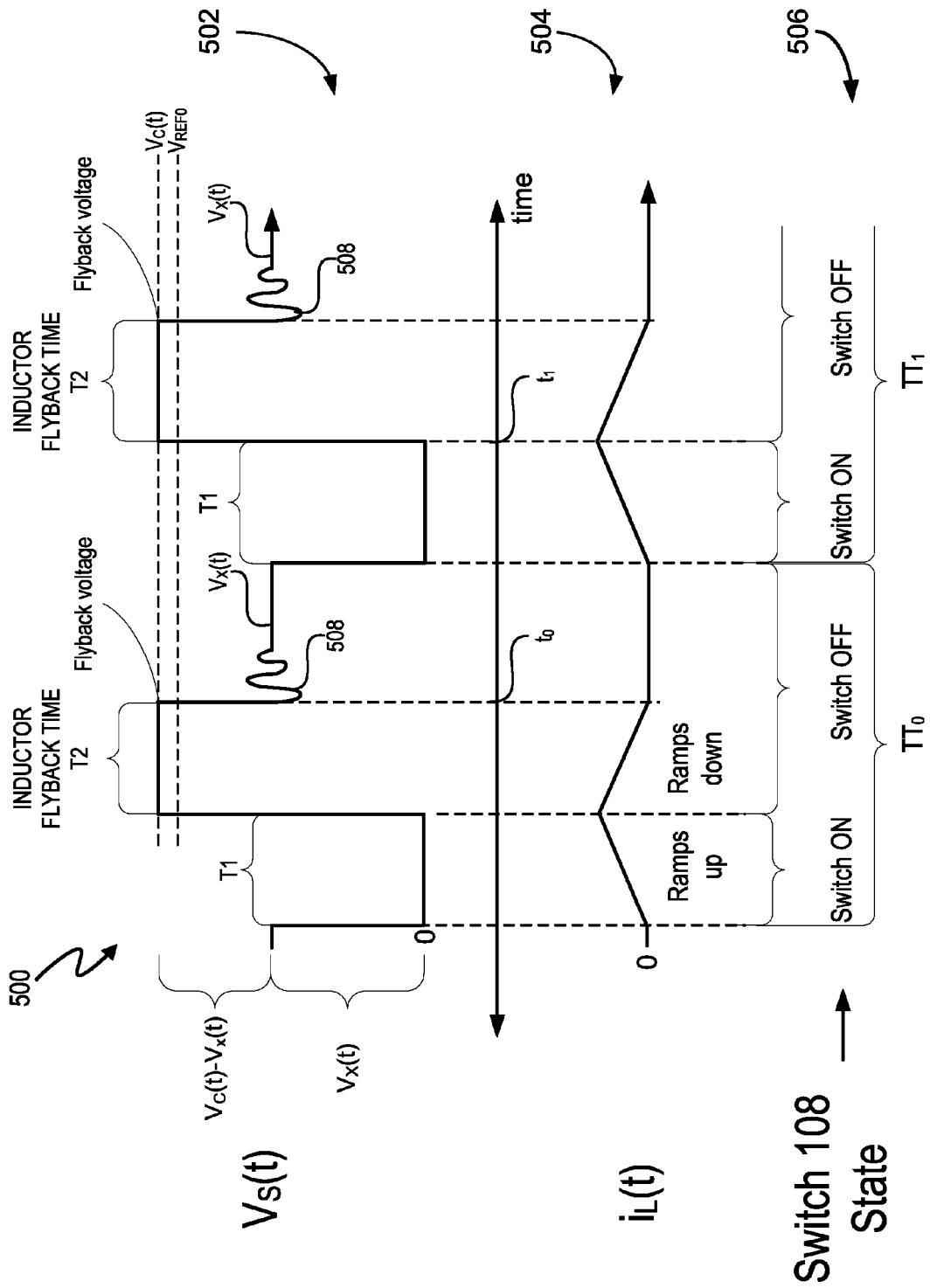
FIG. 5 depicts a time domain graph of a voltage feedback signal, an inductor current $i_L$, and corresponding states of a switching power converter switch.

Referring to FIGS. 4 and 5, FIG. 5 provides an exemplary depiction of inductor flyback time intervals in the context of the voltage $V_S(t)$ at the SWITCH NODE of switching power converter 102 and the inductor current $i_L$. More specifically, FIG. 5 depicts time domain graphs 500 of (i) the voltage feedback signal $V_S(t)$ from the SWITCH NODE (graph 502), (ii) inductor current $i_L$ (graph 504), and (iii) corresponding states of switch 108 (graph 506). Referring to FIGS. 4 and 5, the state of switch 108 is controlled by control signal $CS_1$. Control signal $CS_1$ has a frequency equal to $1/TT_x$, where $TT_x$ is the period of control signal $CS_1$ for the $x^{th}$ frame, and "x" is an integer marker. The frequency $f_{CS1}$ of control signal $CS_1$ can be controlled by PFC and output voltage controller 404. In at least one embodiment, PFC and output voltage controller 404 varies the frequency $f_{CS1}$ to provide a regulated output voltage $V_c(t)$ and in accordance with a predetermined spread spectrum strategy to, for example, reduce electromagnetic interference emissions. The frequency of control signal $CS_1$ is preferably between 20 kHz and 150 kHz, which respectively avoids audio frequencies and inefficient switching frequencies.

During an inductor current $i_L$ ramp-up time interval T1, i.e. when switch 108 is "ON" (i.e. conducts), the inductor current $i_L$ ramps up and the voltage $V_S(t)$ at the SWITCH NODE decreases to at least approximately 0. (The terms "at least approximately" include an exact value and an approximate value). In at least one embodiment, the voltage $V_S(t)$ decreases to approximately 0 because small, non-ideal voltage drops can occur, such as a voltage drop across switch 108 when switch 108 is conducting or a voltage drop across diode 111, so that the voltage of feedback signal $V_S(t)$ differs from, for example, line input voltage $V_x(t)$ or output voltage $V_c(t)$ by such non-ideal voltage drops. However, unless otherwise indicated, for purposes of this application determining or obtaining a line input voltage $V_x(t)$ and/or an output voltage $V_S(t)$ of switching power converter 102 includes determining or obtaining an approximate or scaled line input voltage and/or an approximate or scaled output voltage of switching power converter 102.

During inductor flyback time interval T2 when switch 108 is "OFF" (i.e. nonconductive), diode 111 conducts, the inductor current $i_L$ ramps down to zero (0) amps, and the voltage $V_S(t)$ increases to $V_c(t)$. After the inductor current $i_L$ ramps down to zero (0) amps, diode 111 stops conducting, the voltage drop across inductor 110 is approximately zero, and the voltage of feedback signal $V_S(t)$ equals $V_x(t)$. When the inductor current $i_L$ reaches zero, parasitic impedances, such as the parasitic capacitance across inductor 110, cause a decaying ripple 508 at the SWITCH NODE.

Figure 6:
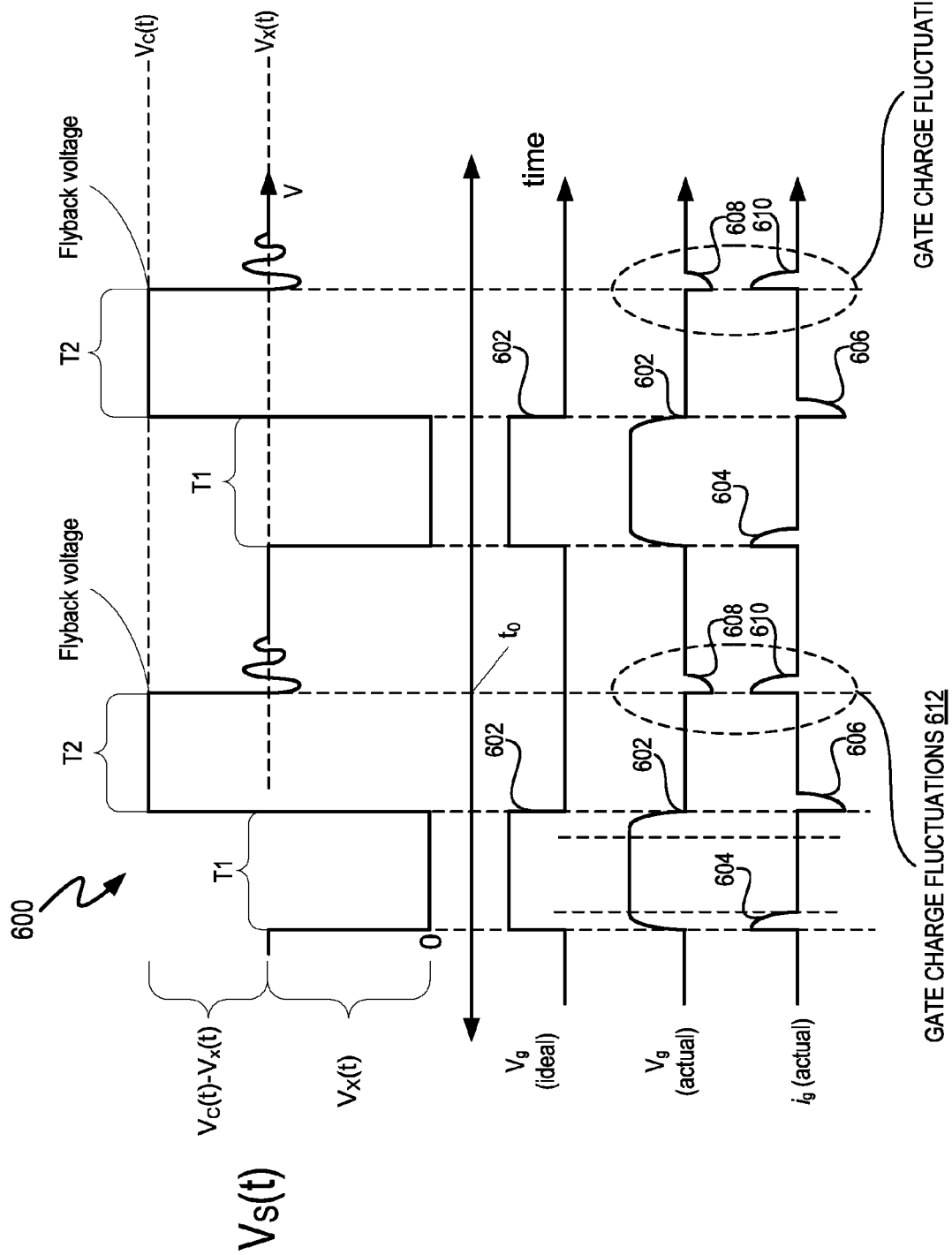
FIG. 6 depicts a graph of a feedback signal and corresponding ideal and actual gate voltages and actual currents of a switching power converter switch.

Power control system 400 determines the end of inductor flyback time interval T2 by monitoring the gate charge characteristics of switch 108 to detect the end of inductor flyback time interval T2. FIG. 6 depicts a graph 600 of feedback signal $V_S(t)$ and corresponding ideal and actual gate voltages $V_g$ and actual gate currents $i_g$. Referring to FIGS. 4 and 6, ideally during each period of control signal $CS_1$, the gate voltage $V_g$ has a logical HIGH pulse 602 corresponding to the switch 108 ON time and is otherwise a logical LOW. Likewise, ideally during each period of control signal $CS_1$, the gate current $i_g$ has a brief pulse 604 to charge the gate of switch 108 and has a brief pulse 606 to discharge the gate of switch 108. Ideally, pulses 604 and 606 are the only pulses of the gate current $i_g$.

The parasitic Miller capacitance 312 causes transient voltage signals 608 and transient current signals 610 at the gate of switch 108 when the feedback signal $V_S(t)$ at the SWITCH NODE transitions from voltage $V_c(t)$ to voltage $V_x(t)$ at the end of the inductor flyback time interval T2. (The transient signals are not necessarily drawn to scale in FIG. 6, and the magnitudes of the transient signals will vary depending upon the components used to implement switching power converter 102.) The transient voltage and current signals each represent embodiments of transient charge fluctuations 612 that are detected by switch gate sensor 310. Upon detection of the transient charge fluctuations, PFC and output voltage controller 404 can determine the inductor flyback time interval T2 by determining the beginning of inductor flyback time interval T2 and determining the elapsed time until the transient signal(s) are detected as described in Melanson I and Melanson II.

Figure 7:
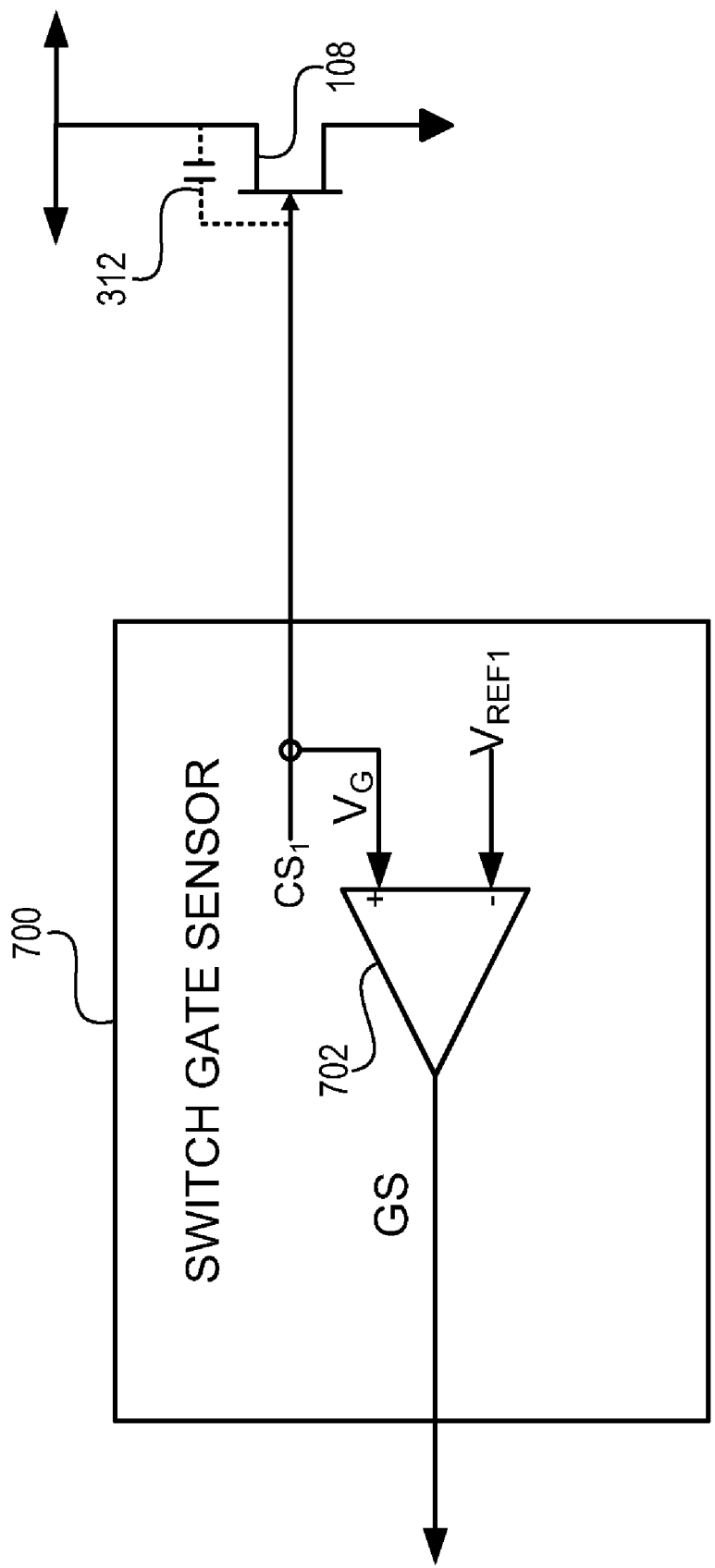
FIG. 7 depicts a switch gate sensor for a switching power converter.

FIG. 7 depicts switch gate sensor 700, which represents one embodiment of switch gate sensor 310. The switch gate sensor 700 detects the gate voltage $V_g$, and comparator 702 compares the gate voltage with a reference voltage $V_{REF1}$. The reference voltage $V_{REF1}$ is predetermined and set between the steady state gate voltage $V_g$ during the inductor flyback time interval T2 and the minimum voltage of the transient 608. In at least one embodiment, $V_{REF1}$ is set at −0.5 V. When the feedback signal $V_S(t)$ transitions from voltage $V_c(t)$ to voltage $V_x(t)$, the gate voltage $V_g$ transient 608 decreases below the reference voltage $V_{REF1}$, and the output signal $V_{SENSE\_1}$ of comparator 702 changes from a logical HIGH to a logical LOW. The transition of the comparator output signal $V_{SENSE\_1}$ of comparator 702 from logical HIGH to logical LOW indicates an end of the inductor flyback time interval T2.

Figure 8:
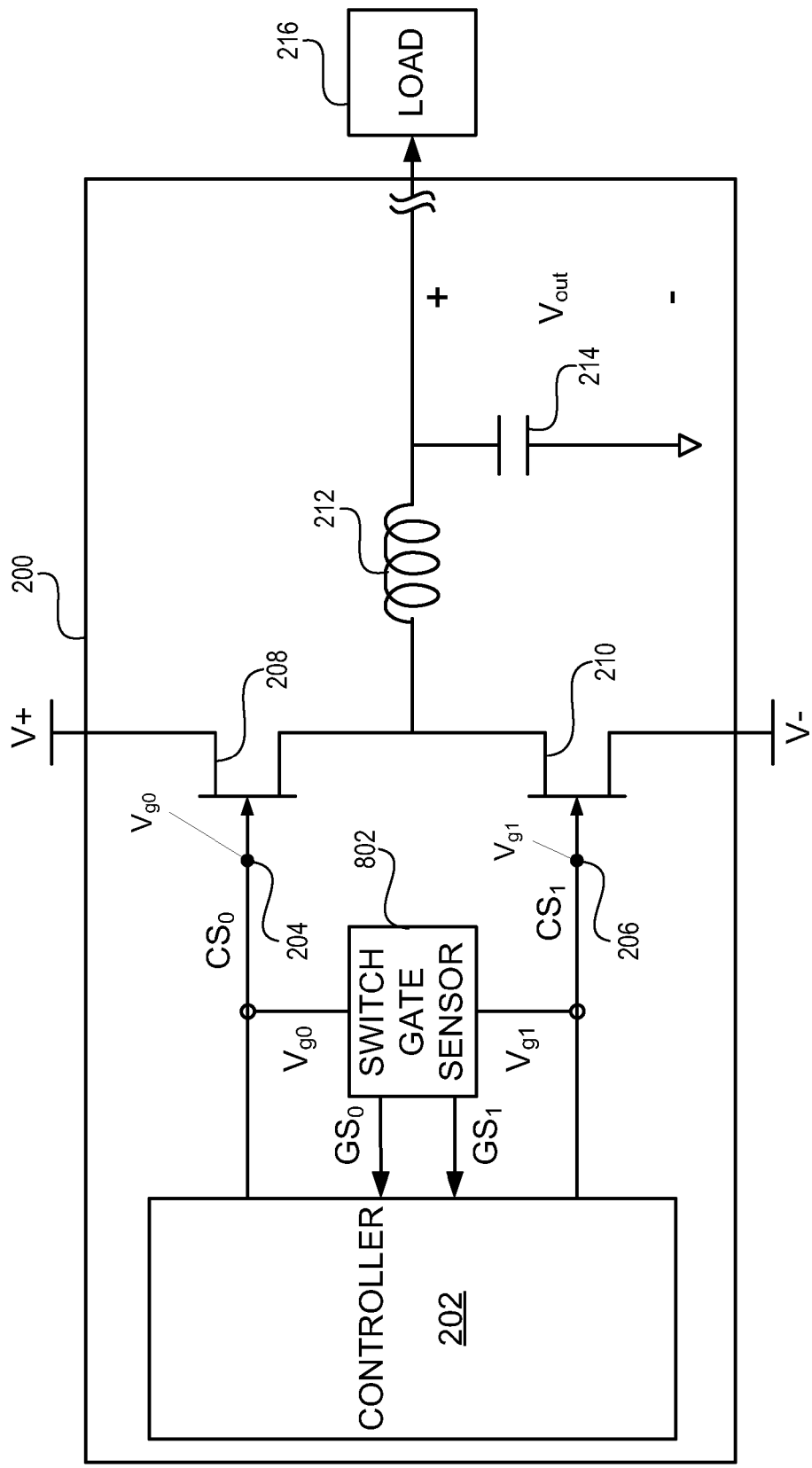
FIG. 8 depicts a class D amplifier with a switch gate sensor.

FIG. 8 depicts an embodiment of a class D amplifier 800. The amplifier 800 represents one embodiment of a class D switching power converter. Amplifier 800 is identical to amplifier 200 except amplifier 800 includes switch gate sensor 802. Switch gate sensor 802 is identical to switch gate sensor 310, except switch gate sensor 802 detects charge fluctuations on the gates of switch 208 and switch 210. In at least one embodiment, switch gate sensor 802 incorporates duel implementations of switch gate sensor 700 to generate respective switch gate sensor signals $GS_0$ and $GS_1$. Switch gate sensor signals $GS_0$ and $GS_1$ represent detection of the charge fluctuations on respective gates 204 and 206 and can, thus, detect when switches 208 and 210 are conductive and non-conductive. In at least one embodiment, controller 202 operates switches 208 and 210 with non-overlapping conduction cycles to prevent switches 208 and 210 from conducting at the same time and, thus, creating a low impedance path between voltage sources V+ and V−. Thus, controller 202 turns switch 208 OFF before turning switch 210 ON and vice versa.

The interim time when switches 208 and 210 are both OFF can create distortion in the output voltage $V_{out}$. To minimize the distortion, in at least one embodiment, controller 202 minimizes the time when both switches 208 and 210 are OFF. Detecting the charge fluctuations on the respective gates 204 and 206 of switches 208 and 210 allows controller 202 to detect when switch 208 is non-conductive and immediately turn ON switch 210 and vice versa. Thus, detecting the charge fluctuations on the respective gates 204 and 206 of switches 208 and 210 allows controller 202 to operate switches 208 and 210 with non-overlapping conduction cycles with a minimal amount of time when both switches 208 and 210 are non-conductive, thus, minimizing distortion.

Thus, a method and system detect charge fluctuations on a gate of a switch in a switching power converter. The detected charge fluctuations indicate an end of a inductor flyback time interval and, in at least one embodiment, can be used in the process of generating a switching power converter control signal.

Although the present invention has been described in detail, it should be understood that various changes, substitutions and alterations can be made hereto without departing from the spirit and scope of the invention as defined by the appended claims.

What is claimed is:

1. An apparatus to detect an end of an inductor flyback time interval of a switching power converter, wherein the switching power converter includes an inductor to couple to an input voltage node and a field effect transistor (FET) switch coupled to the inductor, the apparatus comprising:
   a switch gate sensor to couple to a gate of the switch, wherein during operation of the switch gate sensor, the switch gate sensor is configured to:
   detect a charge characteristic on a gate of the switch associated with an end of the inductor flyback time interval; and
   generate a switch gate sensor signal indicating an end of the inductor flyback time interval.

2. The apparatus of claim 1 wherein the charge characteristic associated with an end of the inductor flyback time interval comprises a gate voltage fluctuation on the gate of the switch.

3. The apparatus of claim 2 wherein the switch gate sensor comprises:
   a comparator having a first input terminal to couple to the gate of the switch and a second input terminal to couple to a reference voltage, wherein the comparator is configured to generate the switch gate sensor signal when a comparison of the gate voltage to the reference voltage by the comparator indicates the end of the inductor flyback time interval.

4. The apparatus of claim 3 wherein the comparator is configured to generate the switch gate sensor signal when the comparison of the gate voltage to the reference voltage indicates the gate voltage is less than the reference voltage.

5. The apparatus of claim 1 wherein the switch gate sensor is further configured to provide the switch gate sensor signal to a power factor correction and output voltage controller.

6. The apparatus of claim 1 wherein the switching power converter is a member of a group consisting of: switching power supplies, switch mode converters, switch mode transformers, and switching amplifiers.

7. The apparatus of claim 1 further comprising a PFC and output voltage controller coupled to the switch gate sensor to receive the switch gate sensor signal.

8. A method to detect an end of an inductor flyback time interval of a switching power converter, wherein the switching power converter includes an inductor to couple to an input voltage node and a field effect transistor (FET) switch coupled to the inductor, the method comprising:
   detecting a charge characteristic on a gate of the switch associated with an end of the inductor flyback time interval; and
   generating a switch gate sensor signal indicating an end of the inductor flyback time interval.

9. The method of claim 8 wherein detecting a charge characteristic on a gate of the switch associated with an end of the inductor flyback time interval comprises detecting a gate voltage fluctuation on the gate of the switch.

10. The method of claim 8 wherein generating a switch gate sensor signal indicating an end of the inductor flyback time interval comprises:

comparing a gate voltage of the switch to a reference voltage; and generating the switch gate sensor signal indicating the end of the inductor flyback time interval when the comparison of the gate voltage to the reference voltage indicates the end of the inductor flyback time interval.

11. The method of claim 10 wherein generating the switch gate sensor signal further comprises:

generating the switch gate sensor signal when the comparison of the gate voltage to the reference voltage indicates the gate voltage is less than the reference voltage.

12. The method of claim 8 further comprising:

providing the switch gate sensor signal to a power factor correction and output voltage controller.

13. The method of claim 8 further comprising:

maintaining a voltage on the gate of the switch during the inductor flyback time interval that prevents the switch from conducting.

14. The method of claim 8 wherein the switching power converter is a member of a group consisting of: switching power supplies, switch mode converters, switch mode transformers, and switching amplifiers.

15. An apparatus to detect an end of an inductor flyback time interval of a switching power converter, wherein the switching power converter includes an inductor to couple to an input voltage node and a field effect transistor (FET) switch coupled to the inductor, the apparatus comprising:

means for detecting a charge characteristic on a gate of the switch associated with an end of the inductor flyback time interval; and means, coupled to the means for detecting, for generating a switch gate sensor signal indicating an end of the inductor flyback time interval.

16. The apparatus of claim 15 wherein the charge characteristic associated with an end of the inductor flyback time interval comprises a gate voltage fluctuation on the gate of the switch.

17. The apparatus of claim 15 wherein the means for generating comprises:

means for comparing a gate voltage of the switch to a reference voltage; and means, coupled to the means for comparing, for generating the switch gate sensor signal indicating the end of the inductor flyback time interval when the comparison of the gate voltage to the reference voltage indicates the end of the inductor flyback time interval.

18. The apparatus of claim 17 wherein means for generating the switch gate sensor signal further comprises means for generating the switch gate sensor signal when the comparison of the gate voltage to the reference voltage indicates gate voltage is less than the reference voltage.

19. The apparatus of claim 15 further comprising:

means, coupled to the means for generating, for providing the switch gate sensor signal to a power factor correction and output voltage controller.

20. The apparatus of claim 15 further comprising:

means for maintaining a voltage on the gate of the switch during the inductor flyback time interval that prevents the switch from conducting.

21. The apparatus of claim 1 wherein the end of the inductor flyback time interval occurs when a current in the inductor decreases to zero, wherein the switch gate sensor is further configured to detect the charge characteristic on the gate of the switch associated with the end of the inductor flyback time interval during operation of the switching power converter in discontinuous current conduction mode.

22. The method of claim 8 wherein the end of the inductor flyback time interval occurs when a current in the inductor decreases to zero and detecting a charge characteristic on a gate of the switch associated with an end of the inductor flyback time interval further comprises:

detecting the charge characteristic on the gate of the switch associated with the end of the inductor flyback time interval during operation of the switching power converter in discontinuous current conduction mode.

23. The apparatus of claim 15 wherein the end of the inductor flyback time interval occurs when a current in the inductor decreases to zero and the means for detecting the charge characteristic on the gate of the switch associated with the end of the inductor flyback time interval further comprises:

means for detecting the charge characteristic on the gate of the switch associated with the end of the inductor flyback time interval during operation of the switching power converter in discontinuous current conduction mode.

* * * * *